United States Patent [19]
Tai et al.

[11] Patent Number: 6,075,427
[45] Date of Patent: Jun. 13, 2000

[54] MCM WITH HIGH Q OVERLAPPING RESONATOR

[75] Inventors: King Lien Tai, Berkeley Heights, N.J.; Jingsong Zhao, Santa Clara, Calif.

[73] Assignee: Lucent Technologies Inc., Murray Hill, N.J.

[21] Appl. No.: 09/012,304

[22] Filed: Jan. 23, 1998

[51] Int. Cl.[7] .................................................. H01P 7/00
[52] U.S. Cl. ........................... 333/219; 333/247; 257/728
[58] Field of Search ..................................... 333/219, 246, 333/247; 257/531, 532, 533, 724, 728

[56] References Cited

U.S. PATENT DOCUMENTS

| | | | |
|---|---|---|---|
| 4,598,276 | 7/1986 | Tait | 333/219 X |
| 4,619,001 | 10/1986 | Kane | 333/219 X |
| 5,049,978 | 9/1991 | Bates et al. | 333/247 X |
| 5,481,131 | 1/1996 | Staudinger et al. | 257/532 |

*Primary Examiner*—Seungsook Ham

[57] ABSTRACT

An MCM including a resonator made using conventional MCM fabrication techniques. The MCM's resonator is constructed with overlapping first and second spiral-shaped regions of metallic material separated by a layer of dielectric material. A via disposed in the layer of dielectric material, couples the spiral-shaped regions of metallic material together, thereby utilizing self winding and internal capacitance to gain resonance at frequencies between 500 MHz to 3GHz. The internal capacitance is increased by controlling the overlap between the first and second spiral-shaped regions of metallic material. On a high-resistivity substrate, the monolithic resonator achieves a Q of at least 19 at approximately 900MHz and at least 24 at approximately 2GHz.

19 Claims, 4 Drawing Sheets

MCM WITH HIGH Q OVERLAPPING RESONATOR

FIELD OF THE INVENTION

The invention relates to Multichip Modules, and more particularly, to a Multichip Module including a high quality factor monolithic resonator made using conventional low-cost silicon technology.

BACKGROUND OF THE INVENTION

The trend in electronic circuits continues to be miniaturization and the performance of an increasingly large number of operations per unit of time. The typical state-of-the-art electronic circuit has numerous integrated circuits disposed on multiple semiconductor chips. Present semiconductor chips process information sufficiently fast such that the overall rate is limited primarily by the speed of the interconnecting conductors.

A Multichip Module (MCM) is a device interconnecting two or more semiconductor chips on a common substrate using extremely short conductors which function only as conducting interconnects. Since the conductors are extremely short, less delay time is encountered in the transmission of an electric signal from one end to the other. The extremely short conductors on the MCM substrate enable higher conductor densities and a smaller package size. Thus, MCMs provide excellent high-speed interconnection for high-performance digital electronic circuits in wireless products such as pagers, cellular phones, wireless modems, televisions, etc. Passive electrical components such as capacitors, resistors, inductors and the like, are embedded on the MCM substrate to provide circuits with various functionalities for matching, decoupling, coupling, and resonance.

A major problem associated with present MCMs is in the design of existing embedded resonators. A resonator is a critical electrical component in bandpass filters, oscillators, voltage-controlled oscillators, image rejection circuits, and other circuits requiring a high impedance at a desired frequency for a given purpose. The efficiency of such circuits require resonators with high quality factors.

Existing MCMs include resonators fabricated from a separate embedded inductor and a separate embedded capacitor, connected in series or in parallel (LC resonators). Other existing MCMs include resonators fabricated from a transmission line structure. MCMs including such resonators have many disadvantages. MCMs including LC resonators occupy more MCM substrate space thereby increasing the size requirements of the MCM. Further, LC resonators using two separate components, exhibit degraded quality factors and, the small capacitance required in the resonator is difficult to precisely achieve using the low-cost silicon fabrication processes. Consequently, the MCMs produced by these processes often result in low yields and poor quality.

If a high quality factor LC resonator is required in existing MCMs, the resonator is typically built off the chip, which increases the number and complexity of the input-output connection design of the resonator package for the chip, and causes spurious resonance from the parasitics of the packaging. MCMs having resonators implemented with transmission lines are not practical for wireless applications because of the high frequencies involved which range between 500MHz-3GHz. Such distributed circuits would require very long conductor lines to achieve the same order as the wavelength. Consequently, MCMs with conventional distributed resonators cannot be used in the circuits for wireless applications.

Studies on MCMs having embedded inductors fabricated on high resistivity silicon have shown that by careful design, the inductor can achieve a high quality factor. Previously, the design goal of a good inductor was to lift the self-resonant frequency well above the working frequency so as to maintain the lumped property. However, parasitic capacitance is almost intrinsic since present technology limits the ability to reduce such effects. By keeping the self-resonant frequency well above the working frequency, the inductance to be achieved has an upper limit.

Accordingly, there is a need for an improved MCM including a high quality factor resonator which avoids the disadvantages of prior art MCMs.

SUMMARY OF THE INVENTION

An improved multichip module has at least two semiconductor chips disposed on a multilayer substrate and a resonator embedded in the substrate. Conductors disposed on the substrate electrically interconnect the semiconductor chips and the resonator. The resonator includes overlapping first and second spiral-shaped conductive regions disposed on a base substrate layer and electrically connected with two of the conductors. A layer of dielectric material is disposed between the first and second spiral-shaped regions and a via extends through the layer of dielectric material to electrically couple the first and second spiral-shaped regions. The resonator exhibits a quality-factor of at least 19 at 900MHz and at least 24 at 2GHz.

BRIEF DESCRIPTION OF THE DRAWINGS

The advantages, nature and various additional features of the MCM will appear more fully upon consideration of the illustrative embodiments now to be described in detail in connection with the accompanying drawings. In the drawings.

DETAILED DESCRIPTION OF THE INVENTION

Figure 1A:
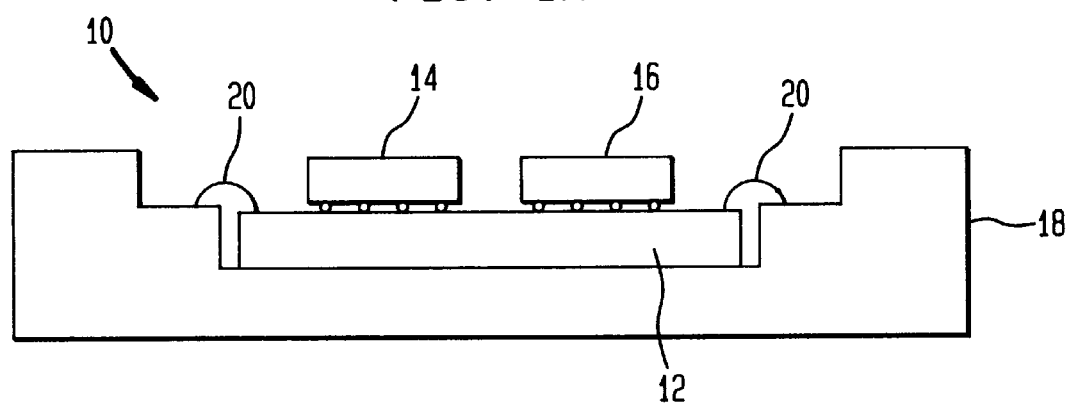
FIG. 1A is an MCM according to a preferred embodiment.

FIG. 1A is a side elevational view of a preferred multichip module (CM) 10. The MCM 10 comprises a multilayer MCM substrate 12 including two semiconductor chips 14, 16, and a package 18 for mounting the MCM substrate 12. Although two semiconductors are depicted on the MCM substrate, other embodiments of the MCM can have any desired number of semiconductor chips. The semiconductor chips 14, 16 are electrically connected to the MCM substrate 12, and the substrate 12 is electrically connected to the package 18 by wire bonds 20. Embedded in the MCM substrate 12 are a plurality passive electrical components (not visible) which form various circuits that operate in conjunction with the semiconductor chips 14, 16. As shown in the plan view of FIG. 1B, metallic conductors 22 electrically interconnect the semiconductor chips 14, 16 and the passive components embedded within the MCM substrate 12.

Figure 1B:
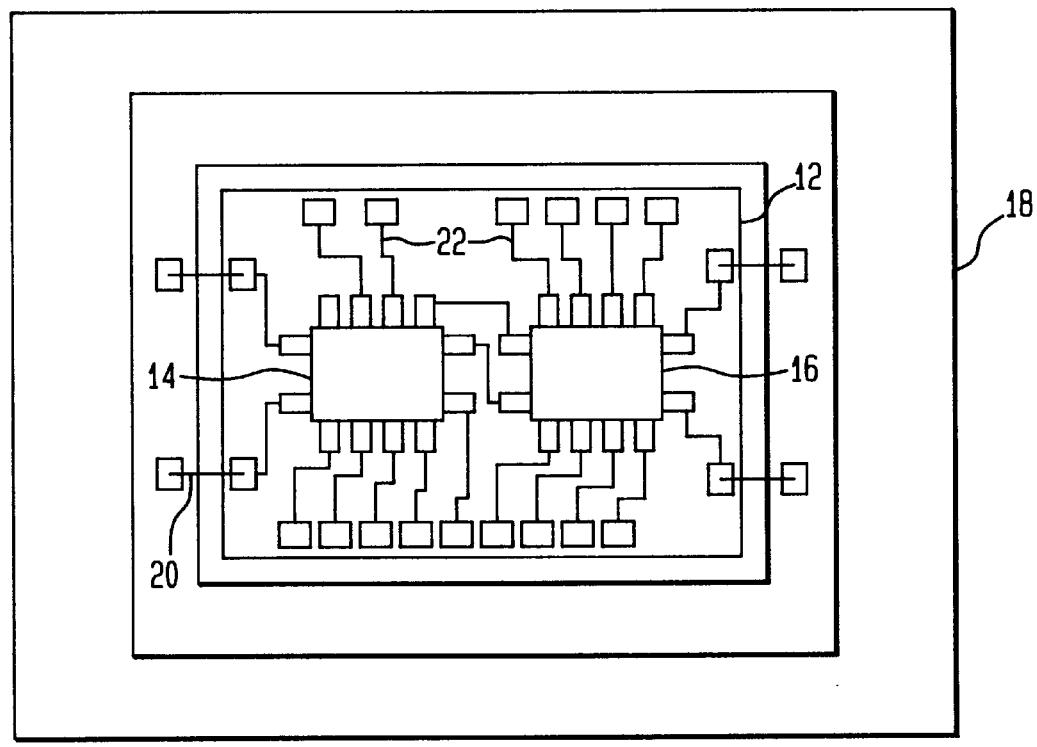
FIG. 1B is a plan view of the multichip module of FIG. 1A.
Figure 2:
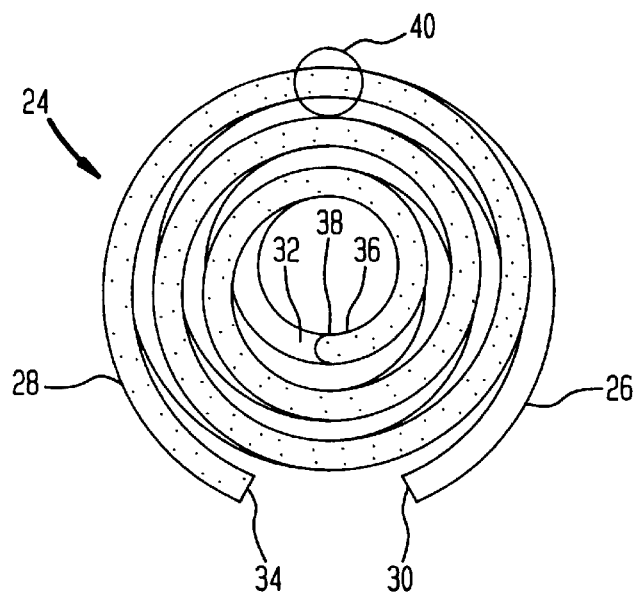
FIG. 2 is a plan view of an overlapping resonator included in the MCM of the preferred embodiment of FIGS. 1A and 1B.

FIG. 2 shows an enlarged plan view of an overlapping monolithic resonator 24 included as one of the passive components embedded in the MCM substrate 12 of FIGS. 1A and 1B. The resonator 24 has overlapping, spiral-shaped first and second layers or regions 26, 28 of metallic material which are separated by a dielectric layer (not shown). The first and second layers 26, 28 function as an inductive element and as the plates of a capacitor. The first and second spiral-shaped layers 26, 28 are preferably configured in a circular geometric pattern to provide the highest possible quality factor (Q). As described further on, the first and second spiral-shaped layers 26, 28 can also be configured in other geometric patterns depending on the size restraints of the substrate 12 as will be explained further on. The first spiral-shaped layer 26 spirals inwardly in a counter-clockwise direction from an outer connector portion 30 to an inner connector portion 32, and the second spiral-shaped layer 28 spirals inwardly in a clockwise direction from an outer connector portion 34 to an inner connector portion 36.

Figure 3:
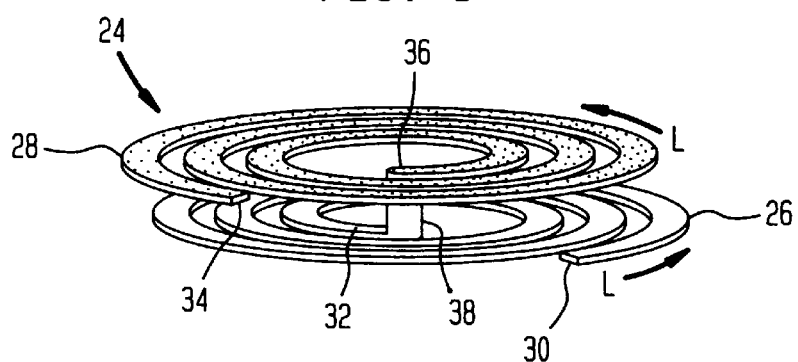
FIG. 3 is a perspective depiction of the resonator of FIG. 2.
Figure 4:
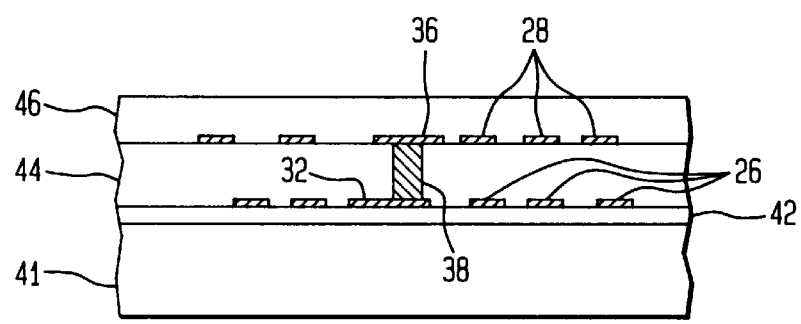
FIG. 4 is cross sectional view through the MCM substrate depicting the formation therein of the resonator of FIG. 2.

As best shown in the perspective view of FIG. 3, the first and second spiral-shaped layers 26, 28 are connected at their inner connector portions 32, 36 by a via 38 which extends between the layers 26, 28 (through the dielectric layer 44 shown in FIG. 4). This structure causes current i to travel in the same spiral direction on both of the spiral-shaped layers 26, 28 which improves the total inductance of the resonator 24.

Referring again to FIG. 2, the overlapping of the two layers 26, 28 as denoted by the circled area 40, is important in achieving a low resonant frequency and high quality factor. However, the overlapping 40 can be easily controlled using the low-cost silicon fabrication techniques that are employed during the fabricating of the multilayer MCM substrate 12 by adjusting and shifting the location of one of the spiral-shaped layers 26, 28 relative to the other.

FIG. 4 is a cross-sectional side view through the multilayer MCM substrate 12 of the MCM 10 depicting the resonator 24 embedded therein. As illustrated, the first spiral-shaped layer 26 of metallic material is shown deposited or otherwise formed on an insulating layer 42 of $SiO_2$ or the like, which covers a base substrate layer 41 of high-resistivity silicon. The earlier mentioned dielectric layer 44 is shown deposited on both the first spiral-shaped layer 26 and the $SiO_2$ layer 42. The dielectric layer 44 can be polyimide material or any other suitable dielectric. An aperture (not shown) is then formed in the dielectric layer 44 to expose the inner connector portion 32 of the first spiral-shaped layer 26, which is shown filled with a conductive material that forms the via 38. The second spiral-shaped layer 28 of metallic material is shown deposited on the dielectric layer 44 such that the inner connector portion 36 thereof contacts the via 38. A layer of polyimide 46 is shown deposited over the second spiral-shaped layer 28 and the dielectric layer 44.

The ability to control and adjust the overlapping of the first and second spiral-shaped layers 26, 28 of metallic material of the resonator provides internal capacitance that effectively lowers the internal frequency to the working frequency of wireless and radio circuits. By eliminating an extra circuit component to form the resonator, the resonator's quality factor is substantially improved, resulting in more efficient MCM operation and, the space requirements of the MCM are reduced. Furthermore, different dielectric materials can be used for the dielectric layer 44 to selectively adjust the resonant frequency of the resonator for various applications.

Figure 5:
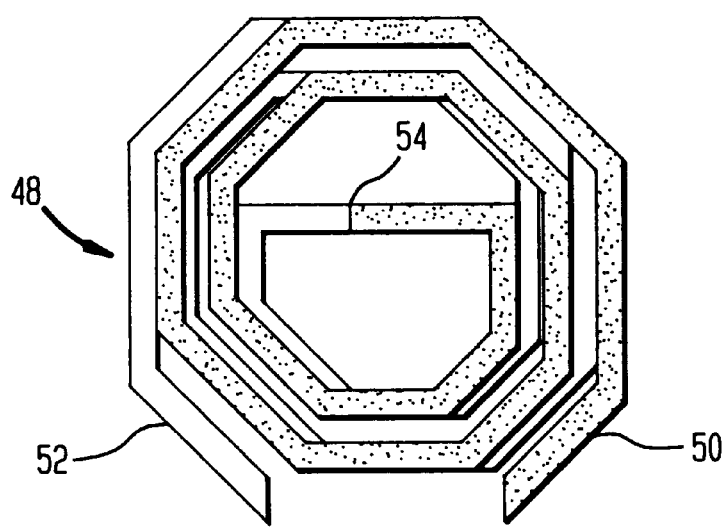
FIG. 5 is a plan view of an overlapping resonator according to a second embodiment.
Figure 6:
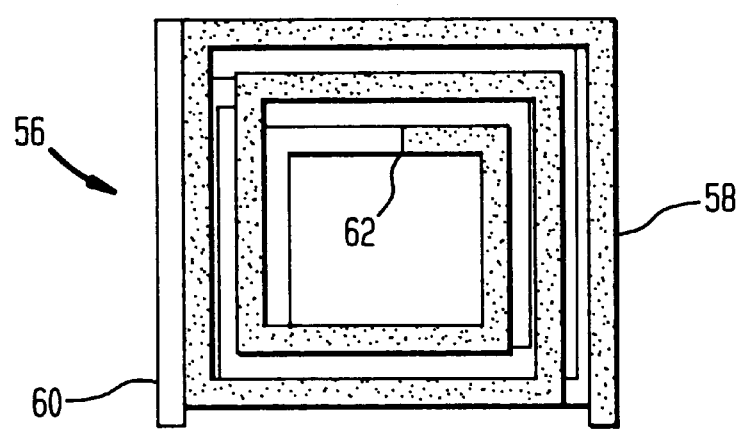
FIG. 6 is a plan view of an overlapping resonator according to a third embodiment.

In FIGS. 5 and 6, other embodiments of the overlapping monolithic resonator used in the MCM of the invention are shown. These resonators 48, 56 are substantially identical to the resonator of the MCM of the preferred embodiment, except for the geometric pattern of the first and second spiral-shaped layers of metallic material. The resonator 48 of FIG. 5 includes overlapping first and second spiral-shaped layers 50, 52 which are configured in an octagonal geometric pattern and coupled together by a via 54. The resonator 56 of FIG. 6 includes overlapping first and second spiral-shaped layers 58, 60 which are configured in a square geometric pattern and coupled together by a via 62.

The resonators 48, 56 of FIGS. 5 and 6, are especially desirable in technologies where it is difficult to impossible, due to space limitations on the MCM substrate, to implement spiral-shaped layers which are circular even though, as discussed later below, measurements show that circular shape resonators provide the highest Q among the three patterns. Nevertheless, in technologies that are hard to implement a circular shaped resonator, the octagonal and square monolithic resonators provide viable options.

Figure 7:
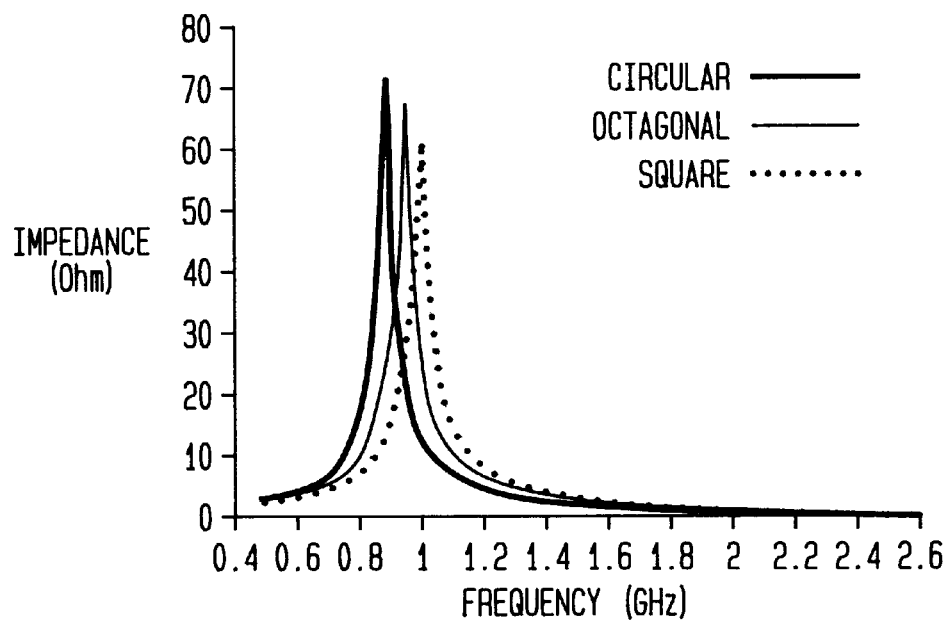
FIG. 7 is a graph showing the impedance over the frequency range for specific examples of circular, octagonal and square resonators designed and built to produce resonant frequencies around 900MHz.
Figure 8:
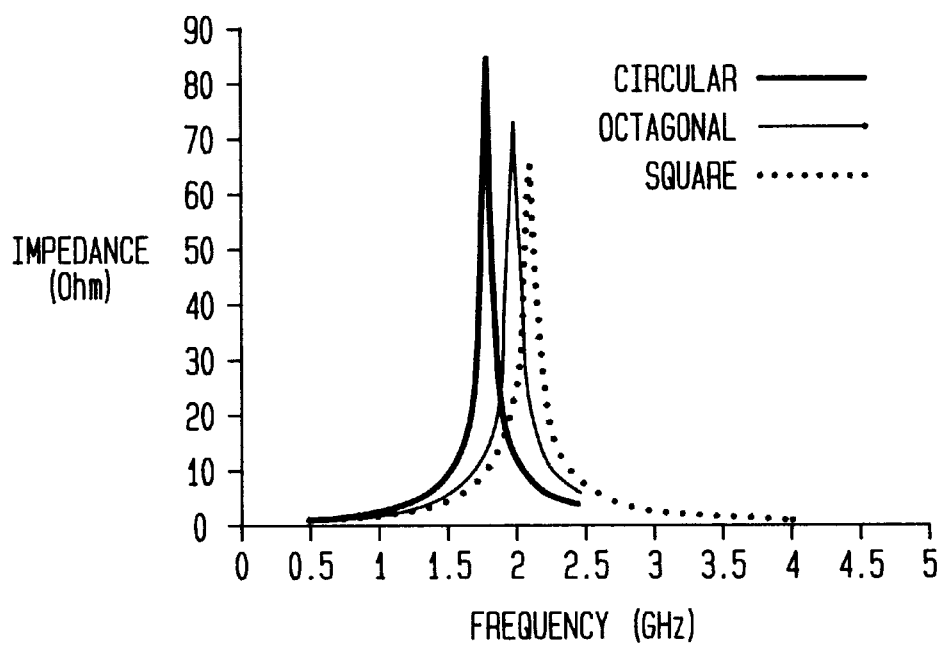
FIG. 8 is a graph showing the impedance over the frequency range for specific examples of the circular, octagonal and square resonators designed and built to produce resonant frequencies around 2GHz.

The measured impedances of specific examples of circular, octagonal, and square overlapping monolithic resonators are graphically shown in FIGS. 7 and 8. The different peak impedances indicate different Q values. In FIG. 7, each resonator was built with a total of 5.5 turns with 2.75 turns for the first spiral-shaped layer and another 2.75 turns for the second spiral-shaped layer. The circular resonator of this group exhibited a Q of about 25, and a resonant frequency of about 896MHz. The octagonal and square resonators of this group exhibited Qs of about 22 and 19 respectively. In FIG. 8, each resonator was built with a total of 3.5 turns with 1.75 turns for the first spiral-shaped layer and another 1.75 turns for the second spiral-shaped layer, are shown. The circular resonator of this group exhibited a Q of about 30, and a resonant frequency of about 1.81 GHz. The octagonal and square resonators of this group exhibited Qs of about 27 and 24 respectively.

It should be understood, that the resonator is not limited to shapes described above and that resonators can be designed with spiral-shaped layers of different geometric patterns. Further, although it is preferred that the overlapping spiral-shaped layers image each other thereby, creating a symmetrical structure, resonators can also be designed with overlapping spiral-shaped layers which have different geometric patterns that provide an asymmetrical structure. Accordingly, modifications and changes, such as those indicated above but, not limited thereto, are considered to be within the scope of the claims.

What is claimed:

1. A monolithic resonator for a multichip module including a multilayer substrate, at least two semiconductor chips disposed on said multilayer substrate, and a plurality of conductors for electrically interconnecting said at least two semiconductor chips, said resonator comprising:

overlapping first and second spiral-shaped regions of metallic material to be electrically connected to said at least two semiconductor chips via at least two of said plurality of conductors;

a layer of dielectric material disposed between said first and second spiral-shaped regions of metallic material; and a via extending through said layer of dielectric material, said via coupling said first and second spiral-shaped regions of metallic material together, thereby utilizing self-winding and internal capacitance to gain resonance at frequencies of 500 MHz to 3GHz.

2. The monolithic resonator according to claim 1, wherein said first and second spiral-shaped regions of metallic material spiral in opposite directions.

3. The monolithic resonator according to claim 1, wherein said first and second spiral-shaped regions of metallic material each spiral in a geometric pattern.

4. The monolithic resonator according to claim 3, wherein said geometric pattern is selected from a group consisting of circular, octagonal, and square-shaped geometric patterns.

5. The monolithic resonator according to claim 3, wherein said geometric pattern of said first spiral-shaped region of metallic material is substantially identical to said geometric pattern of said second spiral-shaped region of metallic material.

6. The monolithic resonator according to claim 3, wherein said geometric pattern of said first spiral-shaped region of metallic material is substantially different than said geometric pattern of said second spiral-shaped region of metallic material.

7. The monolithic resonator according to claim 1, wherein said dielectric material is selected from a predetermined group of dielectric materials which provide a varied selection of internal coupling capacitances that enable said resonator to be set a desired self-resonant frequency.

8. The monolithic resonator according to claim 1, wherein said resonator exhibits a quality-factor of at least 19 at 900MHz and at least 24 at 2GHz.

9. A multichip module suitable for use in wireless applications, comprising:

a multilayer substrate;

at least two semiconductor chips disposed on said multilayer substrate;

a plurality of conductors for electrically interconnecting said at least two semiconductor chips; and a resonator embedded in said multilayer substrate and electrically interconnected with said at least two semiconductor chips via said plurality of conductors, said resonator including;

overlapping first and second spiral-shaped regions of metallic material disposed on a base substrate layer of said multilayer substrate, said first and second spiral-shaped regions electrically connected to said at least two of said plurality of conductors;

a layer of dielectric material disposed between said first and second spiral-shaped regions of metallic material; and a via extending through said regions of dielectric material, electrically coupling said first and second spiral-shaped regions of metallic material together thereby causing current to travel in the same direction on the first and second spiral-shaped regions to enhance the inductance and provide the multi-chip module suitable for use in wireless applications.

10. The multichip module according to claim 9, wherein said resonator exhibits a quality-factor of at least 19 at 900MHz and at least 24 at 2GHz.

11. The multichip module according to claim 9, further comprising a layer of insulating material disposed between said first spiral-shaped region of metallic material and said base substrate layer.

12. The multichip module according to claim 9, further comprising a second layer of dielectric material disposed over said second spiral-shaped region of metallic material.

13. The multichip module according to claim 9, wherein said first and second spiral-shaped regions of metallic material spiral in opposite directions.

14. The multichip module according to claim 9, wherein said first and second spiral-shaped regions of metallic material each spiral in a geometric pattern.

15. The multichip module according to claim 14, wherein said geometric pattern is selected from a group consisting of circular, octagonal, and square-shaped geometric patterns.

16. The multichip module according to claim 14, wherein said geometric pattern of said first spiral-shaped region of metallic material is substantially identical to said geometric pattern of said second spiral-shaped region of metallic material.

17. The multichip module according to claim 14, wherein said geometric pattern of said first spiral-shaped region of metallic material is substantially different than said geometric pattern of said second spiral-shaped region of metallic material.

18. The multichip module according to claim 9, wherein said dielectric material is selected from a predetermined group of dielectric materials which provide a varied selection of internal coupling capacitances that enable said resonator of said multichip module to be set a desired self-resonant frequency.

19. A multichip module suitable for use in wireless applications, comprising:

a multilayer substrate;

at least two semiconductor chips disposed on said multilayer substrate;

a plurality of conductors for electrically interconnecting said at least two semiconductor chips; and a resonator embedded in said multilayer substrate and electrically interconnected with said at least two semiconductor chips via said plurality of conductors, said resonator including;

overlapping first and second spiral-shaped regions of metallic material disposed on a base substrate layer of said multilayer substrate, said first and second spiral-shaped regions electrically connected to said at least two of said plurality of conductors;

a layer of dielectric material disposed between said first and second spiral-shaped regions of metallic material; and a via extending through said regions of dielectric material, electrically coupling said first and second spiral-shaped regions of metallic material together and not to a ground, thereby causing current to travel in the same direction on the first and second spiral-shaped regions to enhance the inductance of the multi-chip module and overlapping conductors to enhance the capacitance of the multi-chip module, such that resonance is gained at frequencies of 500 MHz to 3GHz to provide the multi-chip module suitable for use in wireless applications.

* * * * *